US009557389B2

(12) United States Patent
Wu et al.

(10) Patent No.: US 9,557,389 B2
(45) Date of Patent: Jan. 31, 2017

(54) THREE-PHASE DETECTION MODULE

(71) Applicant: Emerson Climate Technologies, Inc., Sidney, OH (US)

(72) Inventors: Yunfeng Wu, Suzhou (CN); Yongbing Wang, New District (CN)

(73) Assignee: Emerson Climate Technologies, Inc., Sidney, OH (US)

( * ) Notice: Subject to any disclaimer, the term of this patent is extended or adjusted under 35 U.S.C. 154(b) by 56 days.

(21) Appl. No.: 14/275,239

(22) Filed: May 12, 2014

(65) Prior Publication Data

US 2014/0247524 A1 Sep. 4, 2014

Related U.S. Application Data

(63) Continuation of application No. 13/361,167, filed on Jan. 30, 2012, now Pat. No. 8,724,275, which is a
(Continued)

(51) Int. Cl.
*G01R 31/42* (2006.01)
*G01R 19/25* (2006.01)
(Continued)

(52) U.S. Cl.
CPC ........... *G01R 31/42* (2013.01); *G01R 19/2513* (2013.01); *H02H 7/09* (2013.01); *G01R 19/155* (2013.01);
(Continued)

(58) Field of Classification Search
USPC ...................................... 361/77, 85
See application file for complete search history.

(56) References Cited

U.S. PATENT DOCUMENTS 3,633,072 A 1/1972 Duncan
3,727,103 A 4/1973 Finch et al.
(Continued)

FOREIGN PATENT DOCUMENTS

CN 2919264 6/2006
CN 1866659 11/2006
(Continued)

OTHER PUBLICATIONS

Written Opinion of the International Searching Authority regarding International Application No. PCT/US2008/012751 dated Jul. 10, 2009.
(Continued)

*Primary Examiner* — Ann Hoang
(74) *Attorney, Agent, or Firm* — Harness, Dickey & Pierce, P.L.C.

(57) ABSTRACT

A monitoring apparatus is connected, in parallel with a motor, to a plurality of power supply lines. Each of the power supply lines has a different phase. The monitoring apparatus includes a first isolator that selectively allows a first current to flow from a first power supply line to a second power supply line. A second isolator selectively allows a second current to flow from the second power supply line to a third power supply line. A control module controls the first isolator, controls the second isolator, and receives a first signal corresponding to a total current. The total current includes both the first current and the second current. The control module selectively generates a phase failure signal in response to the first signal indicating that a failure of at least one of the power supply lines has occurred.

27 Claims, 16 Drawing Sheets

Related U.S. Application Data continuation of application No. 12/270,139, filed on Nov. 13, 2008, now Pat. No. 8,107,204.

(60) Provisional application No. 60/987,653, filed on Nov. 13, 2007.

(51) Int. Cl.

| | | |
|---|---|---|
| *H02H 7/09* | (2006.01) | |
| *G01R 19/155* | (2006.01) | |
| *G01R 29/16* | (2006.01) | |
| *G01R 19/165* | (2006.01) | |

(52) U.S. Cl.
CPC ......... *G01R 19/16566* (2013.01); *G01R 29/16* (2013.01)

(56) References Cited

U.S. PATENT DOCUMENTS

| | | |
|---|---|---|
| 3,824,430 A | 7/1974 | Hentschel |
| 3,912,991 A | 10/1975 | Moyse |
| 3,970,897 A | 7/1976 | Tamir et al. |
| 3,980,939 A | 9/1976 | Greer |
| 3,999,087 A | 12/1976 | Compton |
| 4,021,703 A | 5/1977 | Gary et al. |
| 4,027,204 A | 5/1977 | Norbeck |
| 4,028,555 A | 6/1977 | O'Brien |
| 4,139,878 A | 2/1979 | Shuey |
| 4,196,378 A | 4/1980 | Shirai |
| 4,251,846 A | 2/1981 | Pearson et al. |
| 4,297,738 A | 10/1981 | Lee |
| 4,354,216 A | 10/1982 | Volta |
| 4,361,793 A | 11/1982 | Nordell |
| 4,363,778 A | 12/1982 | Abbott |
| 4,387,329 A | 6/1983 | Harlow |
| 4,401,940 A | 8/1983 | Pospisil |
| 4,412,169 A | 10/1983 | Dell'Orto |
| 4,453,192 A | 6/1984 | Parks |
| 4,459,528 A | 7/1984 | Nola |
| 4,467,258 A | 8/1984 | Leuthen |
| 4,495,461 A | 1/1985 | Gilliam |
| 4,667,264 A | 5/1987 | Yamazaki et al. |
| 4,763,974 A | 8/1988 | Thaniyavarn |
| 4,800,326 A | 1/1989 | Unsworth |
| 4,802,053 A | 1/1989 | Wojtak et al. |
| 4,823,226 A | 4/1989 | Reed et al. |
| 4,825,328 A | 4/1989 | Izaguirre, Sr. |
| 4,859,884 A | 8/1989 | Yoshino |
| 4,894,609 A | 1/1990 | Fujiki et al. |
| 5,012,182 A | 4/1991 | Fujiki et al. |
| 5,184,063 A | 2/1993 | Eisenhauer |
| 5,337,206 A | 8/1994 | Kadah et al. |
| 5,369,541 A | 11/1994 | Normet |
| 5,406,195 A | 4/1995 | Schweitzer, Jr. |
| 5,442,279 A | 8/1995 | Kitayoshi et al. |
| 5,565,751 A | 10/1996 | Greiser |
| 5,570,257 A | 10/1996 | Manning et al. |
| 5,594,312 A | 1/1997 | Schwendemann et al. |
| 5,703,457 A | 12/1997 | Davis |
| 5,796,565 A | 8/1998 | Verkhovskiy |
| 5,815,067 A | 9/1998 | Knoble et al. |
| 5,847,913 A | 12/1998 | Turner et al. |
| 6,111,736 A | 8/2000 | Blain |
| 6,128,584 A | 10/2000 | Hemminger et al. |
| 6,147,616 A | 11/2000 | Kim |
| 6,304,013 B1 | 10/2001 | Akers et al. |
| 6,320,731 B1 | 11/2001 | Eaves et al. |
| 6,359,421 B1 | 3/2002 | Mueller et al. |
| 6,534,938 B1 | 3/2003 | Wu et al. |
| 6,541,954 B1 | 4/2003 | Gluszek |
| 6,642,700 B2 | 11/2003 | Slade et al. |
| 6,686,714 B2 | 2/2004 | Trifilo |
| 6,703,938 B1 | 3/2004 | Clarke |
| 6,720,749 B2 | 4/2004 | Ta et al. |
| 6,731,033 B2 | 5/2004 | Sakamoto |
| 6,774,614 B2 | 8/2004 | Sahm, III et al. |
| 6,891,343 B2 | 5/2005 | Petersen |
| 6,894,402 B2 | 5/2005 | Dubus et al. |
| 7,006,338 B2 | 2/2006 | Mayhew et al. |
| 7,016,560 B2 | 3/2006 | Ticknor et al. |
| 7,026,773 B2 | 4/2006 | Petersen |
| 7,148,590 B1 | 12/2006 | Lampson |
| 2003/0098709 A1 | 5/2003 | Eckardt |
| 2004/0085087 A1 | 5/2004 | Zehentner et al. |
| 2005/0013085 A1 | 1/2005 | Kinsella et al. |

FOREIGN PATENT DOCUMENTS

| | | |
|---|---|---|
| CN | 2870251 Y | 2/2007 |
| DE | 3002483 A1 | 8/1981 |
| DE | 3117284 A1 | 11/1982 |
| DE | 3320013 A1 | 12/1984 |
| DE | 3528540 A1 | 2/1987 |
| EP | 0845681 | 6/1998 |
| EP | 1152247 A2 | 11/2001 |
| EP | 1401076 | 3/2004 |
| FR | 2336818 A1 | 7/1977 |
| GB | 1566756 A | 5/1980 |
| JP | 52040754 | 3/1977 |
| JP | 54095348 | 7/1979 |
| JP | 59178370 | 10/1984 |
| JP | 61210967 | 9/1986 |
| JP | 02261015 | 10/1990 |
| JP | 06253585 | 9/1994 |
| JP | 08126194 | 5/1996 |
| JP | 11083921 | 3/1999 |
| JP | 2000180491 | 6/2000 |
| JP | 2001025156 | 1/2001 |
| JP | 2002252922 A | 9/2002 |
| JP | 2003302435 | 10/2003 |
| JP | 2007017187 | 1/2007 |
| SU | 1624645 A1 | 1/1991 |
| WO | 9740578 A1 | 10/1997 |

OTHER PUBLICATIONS

International Search Report regarding International Application No. PCT/US2008/012751 dated Jul. 13, 2009.

International Preliminary Report on Patentability regarding International Application No. PCT/US2008/012751, dated May 18, 2010.

THREE-PHASE DETECTION MODULE

CROSS-REFERENCE TO RELATED APPLICATIONS

This application is a continuation of U.S. application Ser. No. 13/361,167, filed on Jan. 30, 2012, now U.S. Pat. No. 8,724,275, which is a continuation of U.S. application Ser. No. 12/270,139, filed on Nov. 13, 2008, now U.S. Pat. No. 8,107,204, and claims the benefit of U.S. Provisional Application No. 60/987,653, filed on Nov. 13, 2007. The entire disclosures of the above applications are incorporated herein by reference.

FIELD

The present disclosure relates to three-phase power and more particularly to systems and methods for detecting conditions of a three-phase power supply.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Distributing electric power in three phases is a common method of electric power transmission. Three-phase power is used to power motors and many other devices. A three-phase power system uses three alternating current (AC) voltage sources whose phases are each separated by 120 degrees. In a balanced three-phase power system, three power supply lines carry three AC signals of the same frequency (and therefore the same period), which reach their instantaneous peak values at different times. Taking a current carried by one of the three power supply lines as a reference, the other two currents are delayed in time by one third and two thirds of one period of the electrical current, respectively.

One common way to produce the three AC voltage sources is to construct an AC generator/alternator in which a rotating magnetic field passes by three sets of wire windings, each set spaced 120 degrees apart around the circumference of the generator/alternator. A phase voltage refers to the amount of voltage measured across any one AC voltage source, such as one set wire winding in an AC generator/alternator.

The windings of a generator or of a motor can be connected to three-phase power supply lines in different configurations, including those shown in FIGS. 1-1A. FIG. 1 depicts a "Δ" (delta) configuration, while FIG. 1A depicts a "Y" configuration, also known as a star configuration. In the delta configuration, the windings are connected between the three power supply lines. In the star configuration, the windings are connected from each of the three power supply lines to a common node. The common node may be connected to a neutral line, which is present in some applications of the star configuration. The neutral line may allow lower voltage devices to be connected between one of the power supply lines and the neutral line, which results in a lower voltage than when connecting between two of the power supply lines.

SUMMARY

An apparatus includes a first optocoupler and a control module. The first optocoupler selectively allows a first current to flow from a first one of a first pair of N power supply lines to a second one of the first pair. N is an integer greater than two. The N power supply lines each provide a phase signal. The control module controls the first optocoupler and determines an occurrence of a phase failure of the phase signals based on a first signal, which is based on the first current.

In other features, the apparatus further includes second and third optocouplers that selectively allow current to flow between second and third pairs of the N power supply lines, respectively. The control module controls the second and third optocouplers. A plurality of optocouplers includes the first, second, and third optocouplers. The control module deactivates others of the optocouplers when activating one of the optocouplers. Each of the plurality of optocouplers allows current to flow while activated.

In other features, the first signal is based on the first current when the first optocoupler is activated, the first signal is based on a second current flowing from a first one of a second pair of the N power supply lines to a second one of the second pair when the second optocoupler is activated, and the first signal is based on a third current flowing from a first one of a third pair of the N power supply lines to a second one of the third pair when the third optocoupler is activated.

In other features, the phase failure includes at least one of a phase loss, a phase order reversal, and a phase magnitude imbalance. The apparatus further includes an output optocoupler that generates the first signal based on a total current including the first current. The total current includes second and third currents from second and third optocouplers.

An apparatus includes a first optocoupler, a device, and a control module. The first optocoupler selectively allows a first current to flow from a first one of N power supply lines to a second one of the N power supply lines. N is an integer greater than two. The N power supply lines each provide a phase signal. The device allows current to flow from the second one of the N power supply lines to the first one of the N power supply lines and prevents current from flowing from the first one of the N power supply lines to the second one of the N power supply lines. The control module controls the first optocoupler and analyzes a first signal, which is based on the first current, to determine a phase failure of the phase signals.

In other features, the apparatus further includes a second optocoupler that selectively allows a second current to flow from the second one of the N power supply lines to a third one of the N power supply lines; and a third optocoupler that selectively allows a third current to flow from the third one of the N power supply lines to the first one of the N power supply lines.

In other features, the apparatus further includes an output optocoupler that receives a sum of the first, second, and third currents and that generates an output current. The first signal is based on the output current. The first, second, and third currents are zero when the first, second, and third optocouplers, respectively, are deactivated.

In other features, the apparatus further includes N Zener diodes that each allow current flow from the output optocoupler to a node of a respective one of the first, second, and third optocouplers. The N Zener diodes each allow current flow from the node of the respective one of the first, second, and third optocouplers to the output optocoupler when a voltage applied to the Zener diode is above a predetermined threshold.

In other features, the apparatus further includes N diodes that each allow current flow from a node of a respective one of the first, second, and third optocouplers to a corresponding one of the N power supply lines. The device includes one of the N diodes. The apparatus further includes N resistances, each connected between one of the first, second, and third optocouplers and a respective one of the N power supply lines. The apparatus further includes N varistors, each connected between a respective two of the N power supply lines.

An apparatus includes N resistances, N switching devices, an output device, N unidirectional devices, and a control module. N is an integer greater than two. N switching devices each have first and second ends and each selectively electrically connect the first end to the second end. The first ends are coupled to respective ones of N power lines via the N resistances. The second ends are connected to a common node. Each of the N power lines carries a power signal having a different one of N phases. The output device is connected between the common node and a second node and generates an output signal based on a current flowing between the common node and the second node. The N unidirectional devices each allow current to flow from a node at the first end of a respective one of the N switching devices to a corresponding one of the N power lines and each inhibit current flow toward the first ends. The control module analyzes the output signal to determine a failure of the power signals and selectively generates N control signals that respectively control the N switching devices.

In other features, the apparatus further includes N Zener diodes that each allow current to flow from the second node to the node at the first end of a respective one of the N switching devices and that each selectively inhibit current flow toward the second node. Each of the N unidirectional devices includes a diode. Each of the N switching devices includes an optocoupler. The output device includes an optocoupler. The apparatus further includes N varistors that are each connected between two of the N power lines.

A method includes receiving N power signals, each having a different one of N phases, over N power supply lines, wherein N is an integer greater than two; selectively activating a first switch to allow a first current to flow from a first one of the N power supply lines to a second one of the N power supply lines; generating a signal based on the first current; and selectively generating a phase failure signal when the signal is less than a predetermined threshold.

In other features, the method further includes controlling a motor based on the phase failure signal. The method further includes halting operation of the motor when the phase failure signal is generated. The method further includes activating the first switch for a predetermined period of time. The predetermined period is based on a duration of one cycle of one of the N power signals. The predetermined period is equal to the duration plus a predetermined value.

In other features, the method further includes selectively activating a second switch to allow a second current to flow from the second one of the N power supply lines to a third one of the N power supply lines; and selectively activating a third switch to allow a third current to flow from the third one of the N power supply lines to the first one of the N power supply lines. The method further includes deactivating remaining ones of the switches when activating one of the first, second, and third switches.

In other features, the method further includes sequentially activating the first, second, and third switches. The method further includes generating the signal based on the first, second, and third currents. The signal is proportional to a sum of the first, second, and third currents. The first, second, and third currents are zero when the first, second, and third switches, respectively, are deactivated. The method further includes generating the phase failure signal when a peak value of the signal is less than a predetermined threshold and one of the first, second, and third switches is activated.

In other features, the method further includes generating the phase failure signal when the peak value of the signal over a predetermined period is less than the predetermined threshold. The method further includes determining a first peak value of the signal when the first switch is activated; determining a second peak value of the signal when the second switch is activated; determining a third peak value of the signal when the third switch is activated; and generating the phase failure signal when a difference between the first, second, and third peak values is greater than a predetermined limit.

In other features, the method further includes activating the first switch; comparing the signal to a threshold value while the first switch is activated; after the signal exceeds the threshold value, alternately activating the second switch and the third switch; comparing the signal to the threshold value while the second switch is activated and while the third switch is activated; and generating the phase failure signal when the signal exceeds the threshold value while the third switch is activated prior to the signal exceeding the threshold value while the second switch is activated.

In other features, the method further includes activating the first switch; comparing the signal to a threshold value while the first switch is activated; after the signal exceeds the threshold value, alternately activating the second switch and the third switch; determining a first time at which the signal exceeds the threshold value while the second switch is activated; determining a second time at which the signal exceeds the threshold value while the third switch is activated; and generating the phase failure signal when the first time is after the second time.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The drawings described herein are for illustration purposes only and are not intended to limit the scope of the present disclosure in any way.

DETAILED DESCRIPTION

Figure 2:
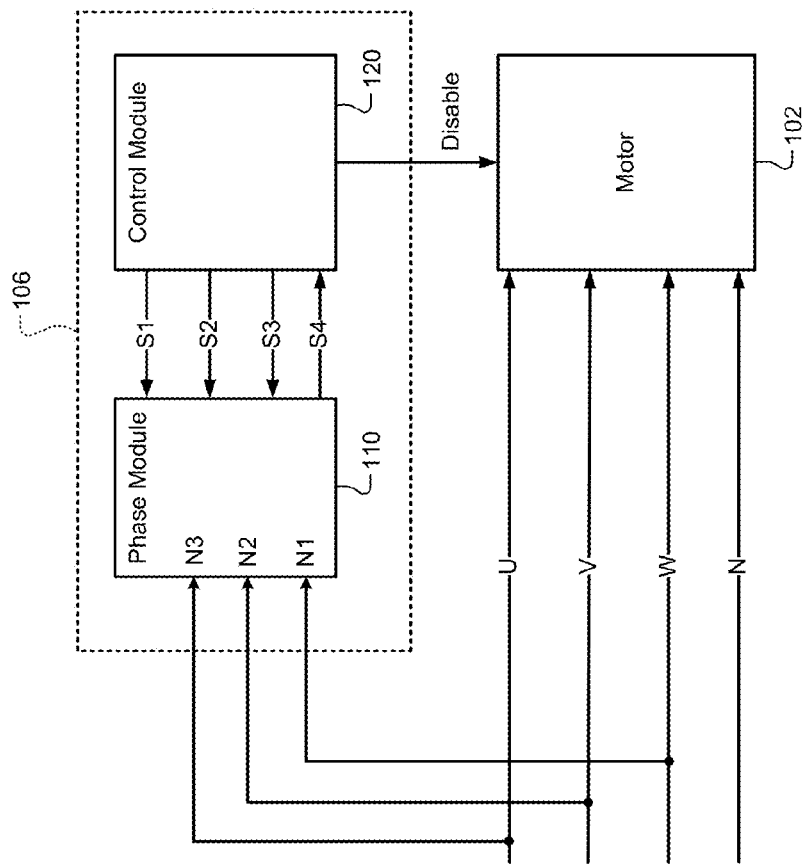
FIG. 2 is a functional block diagram of an exemplary motor system according to the principles of the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
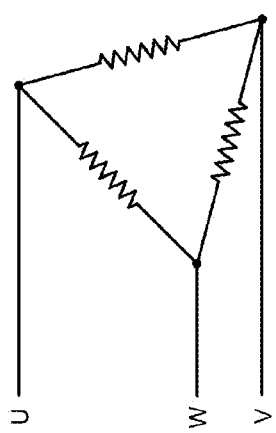
FIGS. 1-1A are exemplary schematics of motor winding connections according to the prior art.
Figure 1A:
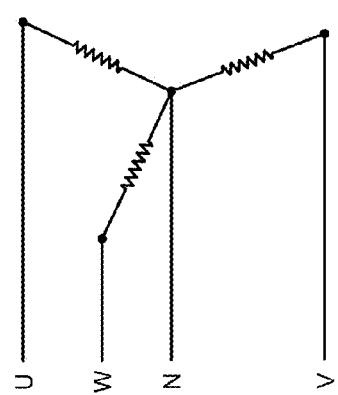

Referring to FIG. 2, a motor 102 receives three-phase power via U, V, and W power supply lines. Power signals on the U, V, and W power supply lines have phases of φU, φV, φW, respectively, which are different from each other by 120 degrees (2/3*pi radians). A neutral line may also be connected to the motor 102. For example only, windings of the motor may be configured as shown in FIGS. 1-1A. Although three-phase power is shown, the principles of the present disclosure apply to multiphase power having more than three phases.

A control system 106 including a phase module 110 and a control module 120 also receives the U, V, and W power signals. The phase module 110 receives the U, V, and W power signals at nodes N3, N2, and N1, respectively. The phase module 110 outputs a signal S4 based on a voltage difference between two of the power signals to a control module 120. The control module 120 controls the phase module 110 using selection signals S1, S2, and S3.

Voltage differences may be referred to as line voltages. For example, line voltage UV refers to the voltage difference from power signal U to power signal V; line voltage VW refers to the voltage difference from power signal V to power signal W; line voltage WU refers to the voltage difference from power signal W to power signal U.

The control module 120 may generate the selection signals S1, S2, and S3 to select one of the line voltages. For example, by activating the selection signal S1 and deactivating the selection signals S2 and S3, the phase module 110 may output a signal as S4 based on UV. Similarly, activating the selection signals S2 and S3 cause S4 to be based on VW and WU, respectively.

The control module 120 may activate one of the selection signals for at least a predetermined period. For example, the predetermined period of time may be equal to the length of one cycle of power plus a tolerance value (for example, 3-5 milliseconds). The length of one cycle may be 20 milliseconds for 50 Hertz power or 16.7 milliseconds for 60 Hertz power.

The control module 120 analyzes signal S4 to determine if there are any problems with the incoming three-phase power. For example, the control module 120 may detect whether one of the U, V, or W power signals is missing, whether the phases of the power signals is wrong, and/or whether voltages of the power signals are imbalanced.

Figure 2A:
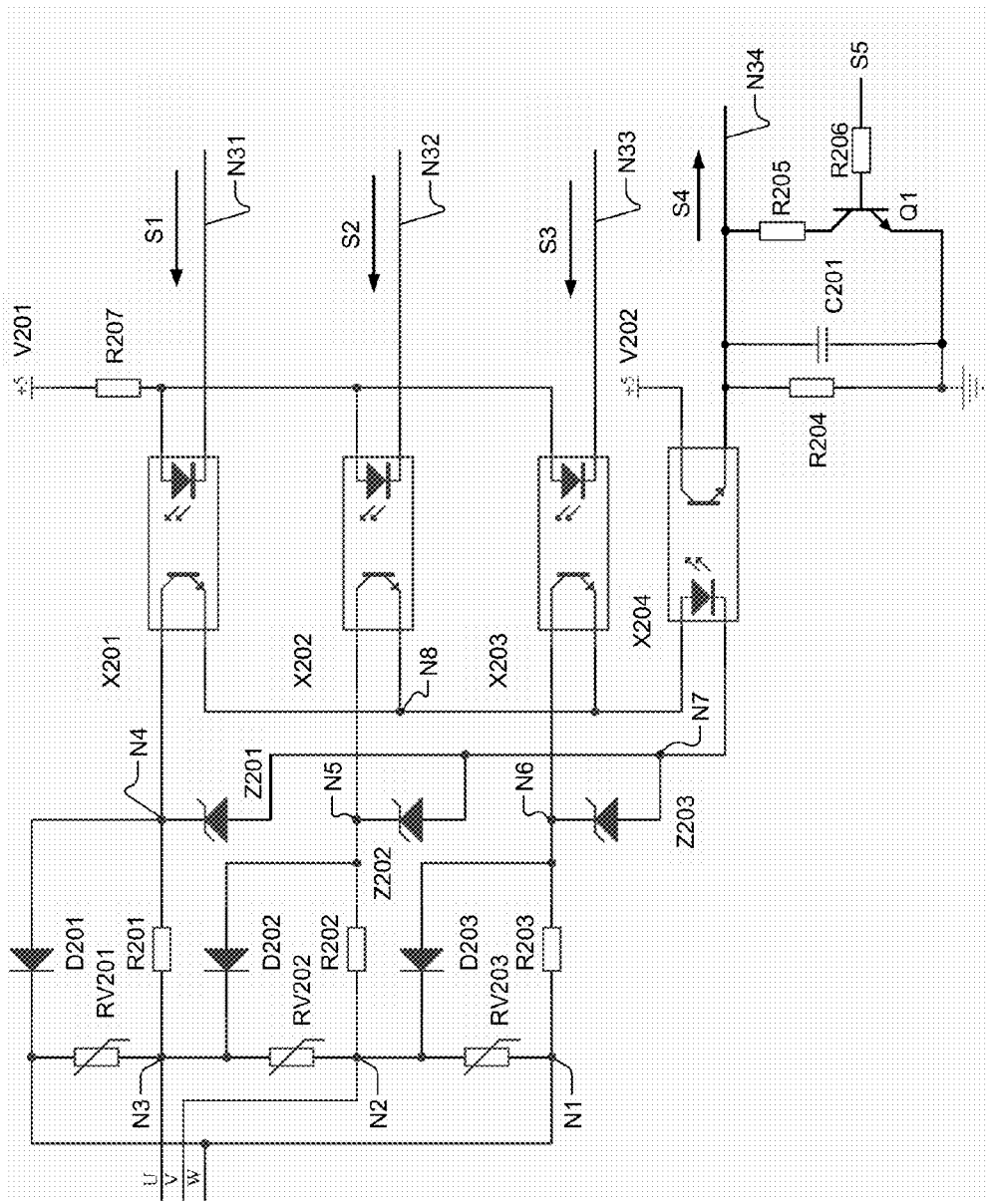
FIG. 2A is a schematic diagram of an exemplary implementation of the phase module according to the principles of the present disclosure.

Referring to FIG. 2A, an exemplary implementation of the phase module 110 is shown. Power supply line U connects to a first end of a resistor R201 and a cathode of a diode D202 at a node N3; power supply line V connects to a first end of a resistor R202 and a cathode of a diode D203 at a node N2; power supply line W connects to a first end of a resistor R203 and a cathode of a diode D201 at a node N1. A varistor RV201 is connected between the node N3 and the node N1; a varistor RV202 is connected between the node N3 and the node N2; and a varistor RV203 is connected between the node N2 and the node N1. In various implementations, varistors RV201, RV202, and RV203 may be metal oxide varistors.

An anode of the diode D201 and the other end of the resistor R201 connect to a cathode of a zener diode Z201 at a node N4; an anode of the diode D202 and the other end of the resistor R202 connect to a cathode of a zener diode Z202 at a node N5; an anode of the diode D203 and the other end of the resistor R203 connect to a cathode of a zener diode Z203 at a node N6. Anodes of the zener diode Z201, the zener diode Z202, and the zener diode Z203 connect at a node N7.

The node N4 connects to a collector of an optical coupler X201; node N5 connects to a collector of an optical coupler X202; and node N6 connects to a collector of an optical coupler X203. Emitters of optical coupler X201, optical coupler X202, and optical coupler X203 connect to an anode of an optical coupler X204 at node N8. A cathode of optical coupler X204 connects to node N7.

A voltage input V201 connects through resistor R207 to anodes of the optical coupler X201, the optical coupler X202, and the optical coupler X203. A cathode of the optical coupler X201 receives the selection signal S1 at a node N31; a cathode of the optical coupler X202 receives the selection signal S2 at a node N32; and a cathode of the optical coupler X203 receives the selection signal S3 at a node N33.

A collector of the optical coupler X204 connects to a voltage input V202. In various implementations, the voltage inputs V201 and V202 may have approximately equal voltages and may be from the same power source. An emitter of the optical coupler X204 outputs the line voltage signal S4 to the control module 120 via node N34. A resistor R204 and a capacitor C201 are connected between the node N34 and a ground potential.

A variable resistance to ground may be created at the node N34. For example, a bipolar junction transistor (BJT) Q1 may be included, where an emitter of BJT Q1 is connected to the ground potential and a collector of BJT Q1 is connected to the node N34 via a resistor R205. A base of BJT Q1 receives a signal S5 via a resistor R206. The signal S5 may be provided by the control module 120.

When the signal S5 is activated, the resistance to ground seen by the node N34 is reduced. For a given current through the optical coupler X204, reducing the resistance to ground reduces the voltage output to S4. This allows the range of the measured voltage to be changed. To maximize the precision of measurement, measured voltages should be as large as possible without reaching the voltage input V202.

The voltage range may be varied to counteract circuit changes. For example, over time, a current transfer ratio of optical couplers, such as the optical coupler X204, may decrease. The voltage range may therefore be increased to counteract this decrease in current. The voltage range may also be varied to accommodate different power voltages, such as may be used by different countries or different electrical grids. In addition, the voltage range may be adjusted when moving between power generated by delta or star configurations.

The resistors R201, R202, and R203 are current limiting resistors that limit the current input to the optical couplers X201, X202, and X203. The varistors RV201, RV202, and RV203 may absorb excessive transient voltages between the power supply lines. The diodes Z201, Z202, and Z203 provide alternative current paths when optical couplers are deactivated.

When any of the selection signals S1, S2, or S3, is low, a current from voltage input V201 causes a light-emitting diode (LED) of the corresponding optical coupler to emit light, which energizes a base of a phototransistor, allowing current to flow from the collector to the emitter of the optical coupler. Thus, the selection signals S1, S2, or S3 are active-low.

The control module 120 may generate values for the selection signals S1, S2, or S3 corresponding to four modes. In mode 1, the selection signal S1 is active and the selection signals S2 and S3 are inactive. This causes the signal S4 to be based on line voltage UV. In various implementations, negative values of the line voltage UV will not reach the signal S4, as described in more detail below.

Because the circuit of FIG. 2A does not rely on a neutral line, the circuit can analyze power corresponding to both a star three-phase configuration, which may or may not have an associated neutral line, and a delta three-phase configuration, which does not normally have an associated neutral line. For example only, even if three-phase power was generated using a star configuration including a neutral line, the neutral line may not be present at the motor, such as when the motor's windings are in a delta configuration. The circuit of FIG. 2A may therefore be used with any three-phase power regardless of the star/delta configuration of the generating source or the consuming motor.

Figure 2B:
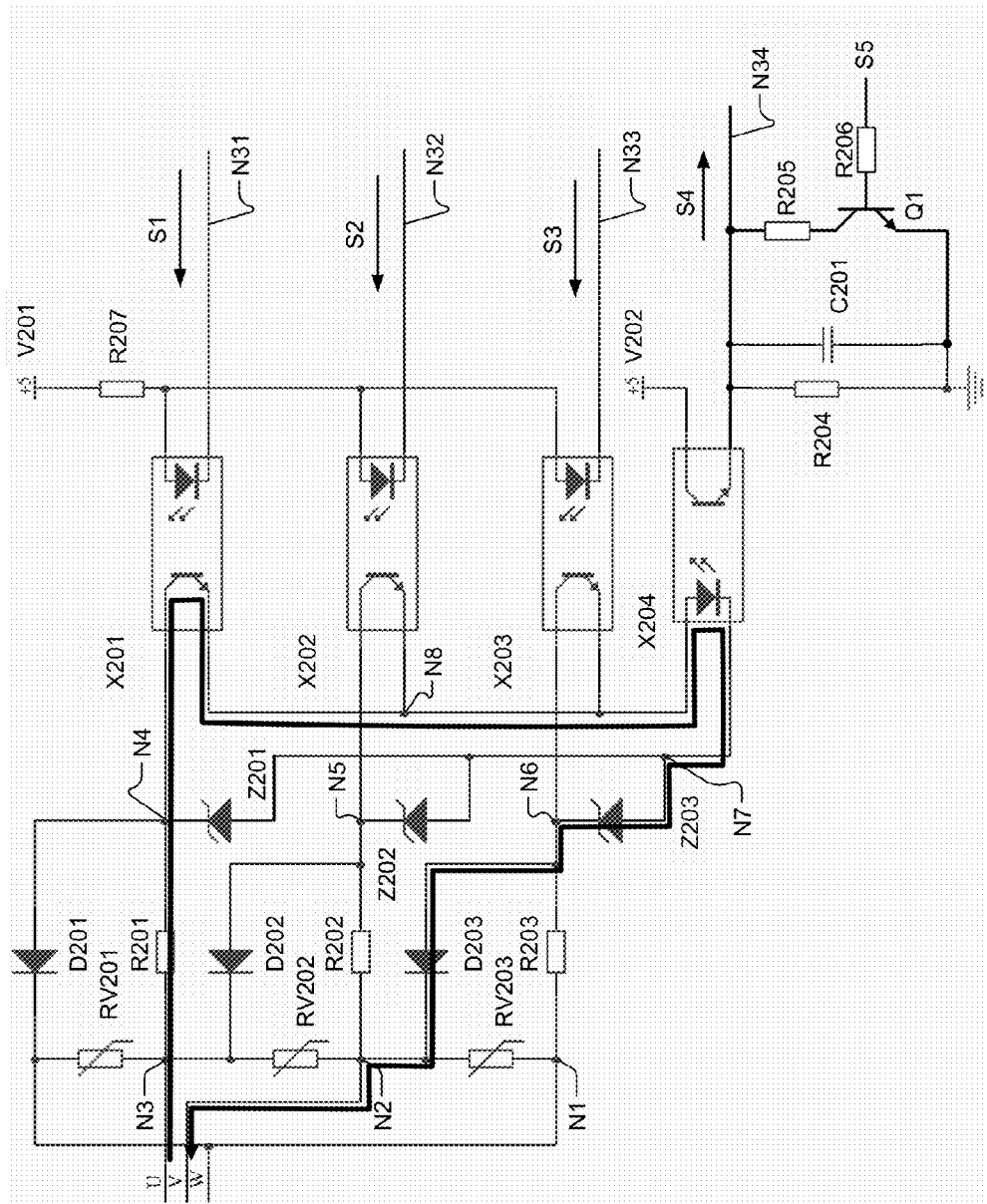
FIGS. 2B-2C are schematic diagrams showing exemplary current flow in the phase module of FIG. 2A.

As shown in FIG. 2B, when the phase module 110 operates in mode 1 and the line voltage UV is positive, a current from power supply line U flows through the resistor R201, the optical coupler X201, the optical coupler X204, the zener diode Z203, the node N6, and the diode D203, reaching the power supply line V. This current activates an LED of the optical coupler X204, thereby activating a phototransistor of the optical coupler X204, producing a current. This current reaches ground, such as by the resistor R204, thereby creating a voltage at the node N34.

In mode 2, the selection signal S2 is low and the selection signals S1 and S3 are high. Current then flows from the power supply line V to the power supply line W in a similar manner to that of mode 1. In mode 3, the selection signal S3 is low and the selection signals S1 and S2 are high, allowing current to flow from the power supply line W to the power supply line U. In mode 4, all the selection signals are high, which deactivates the optical couplers X201, X202, and X203.

The zener diodes may provide an alternative current path when the line voltage UV, the line voltage VW, or the line voltage WU are great enough and the corresponding optical coupler to the line voltage is deactivated. When the line voltage UV is positive and the optical coupler X201 is deactivated, current may flow through the zener diode Z201 in the reverse direction. This current may reach the power supply line V via the zener diode Z202 and the resistor R202 or the zener diode Z203 and the diode D203. Similar current flows are present for VW and WU.

Figure 2C:
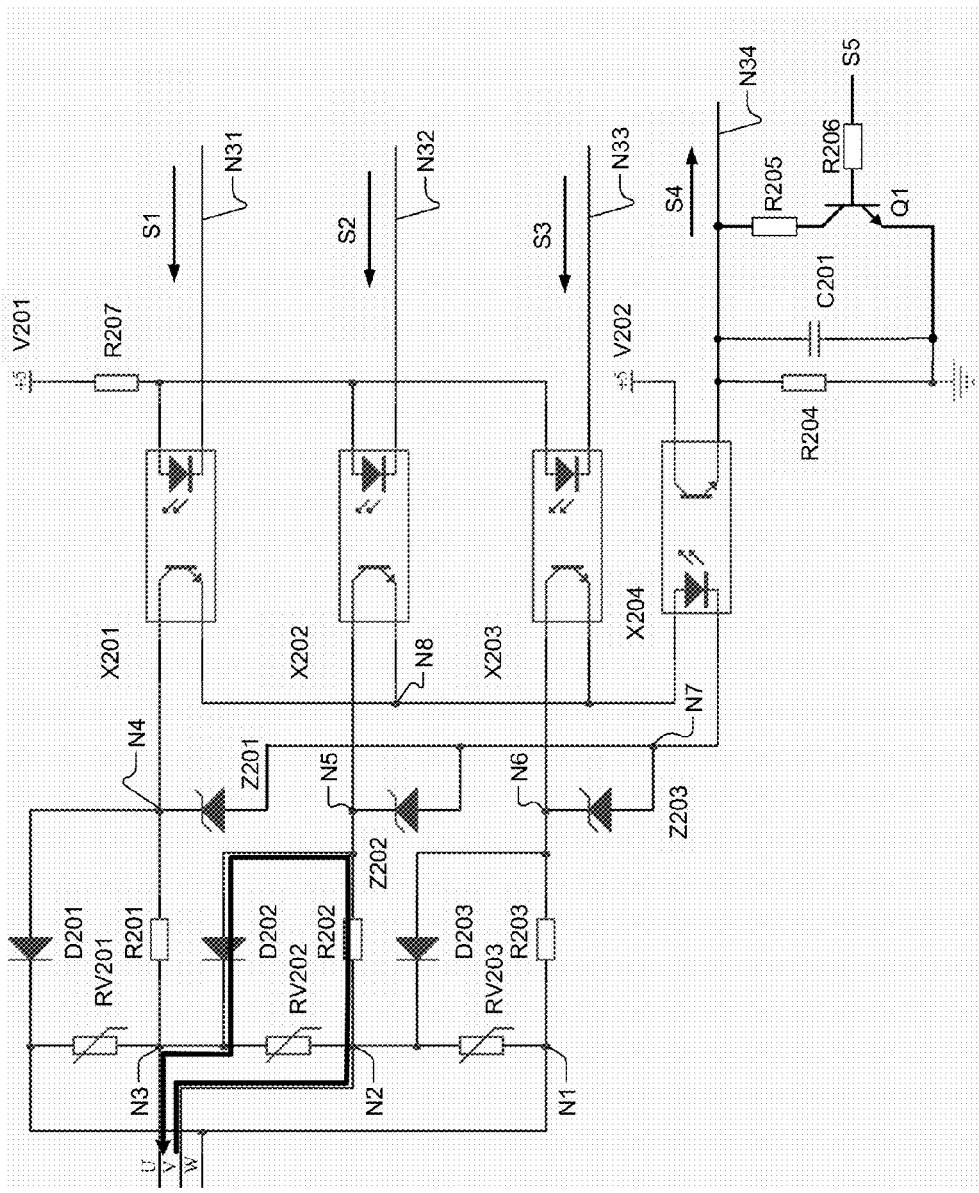

As shown in FIG. 2C, when the line voltage UV is negative, regardless of mode, a current may flow from the power supply line V to the power supply line U. This current may flow from the power supply line V flows through the resistor R202, the diode D202 to reach the power supply line U. Similar current flows are present for negative values of VW and WU.

Figure 3:
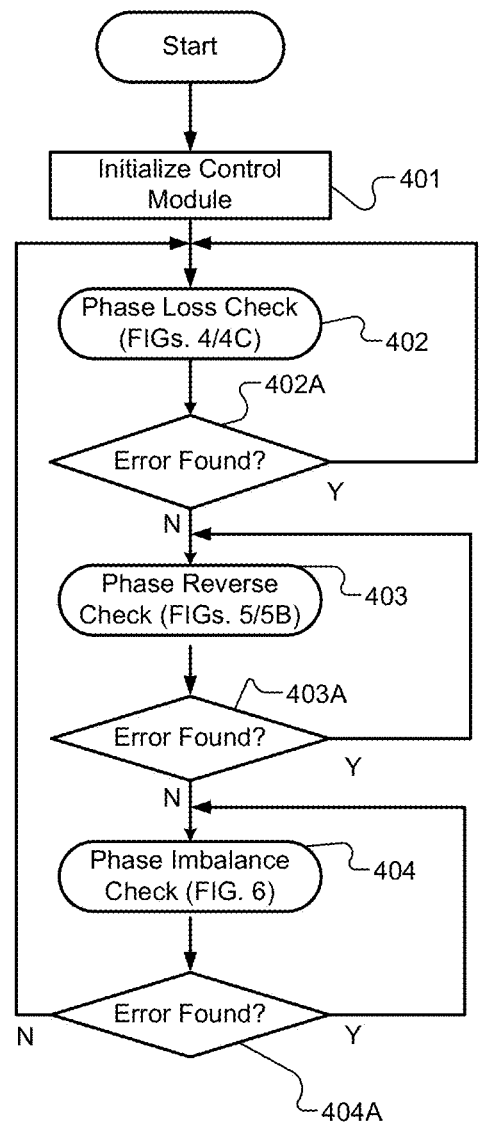
FIGS. 3-3A are flowcharts depicting steps performed by exemplary implementations of the control module of FIG. 2 according to the principles of the present disclosure.

Referring now to FIG. 3, a flowchart illustrates exemplary control of control module 120. In step 401, the control module 120 is initialized. In step 402, control checks whether a phase loss has occurred and sends out error messages accordingly. For example only, a phase loss may be detected when one of the line voltages UV, VW, or WU is less than a predetermined threshold. For example only, if the line voltage UV remains less than the predetermined threshold over an entire power cycle, one or both of the power signals U and V may be zero or unusually low. In step 402A, if a phase loss was detected, control returns back to step 402; otherwise, control returns to step 403.

In step 403, control determines whether a phase order reversal has occurred and sends out error messages accordingly. Because the phase voltages U, V, and W are separated by 120 degrees, the line voltages UV, VW, and WU may also be out of phase by 120 degrees. Each of the line voltages will reach a peak voltage at a different time. The order in which the line voltages reaches their peak voltage may be predetermined. A deviation from this predetermined order may cause inefficient or even damaging operation of an attached motor. For example, a motor may be configured to use line voltages reaching their peak in the following order: UV, VW, WU. If the order changes to UV, WU, VW, a phase order reversal had occurred.

In step 403A, if a phase order reversal was detected, control returns to step 403; otherwise, control goes to step 404. In step 404, control determines whether a phase magnitude imbalance has occurred and sends out error messages accordingly. A phase magnitude imbalance may be defined as any two of the line voltages differing in magnitude by more than a predetermined limit. For example only, peak magnitude values of each of the line voltages may be compared.

In step 404A, if a phase magnitude imbalance is detected, control returns to step 404; otherwise, control returns to step 402. Control may wait before returning to step 402, causing detection to be performed intermittently. This may save power at the expense of potentially slower detection of errors.

Figure 3A:
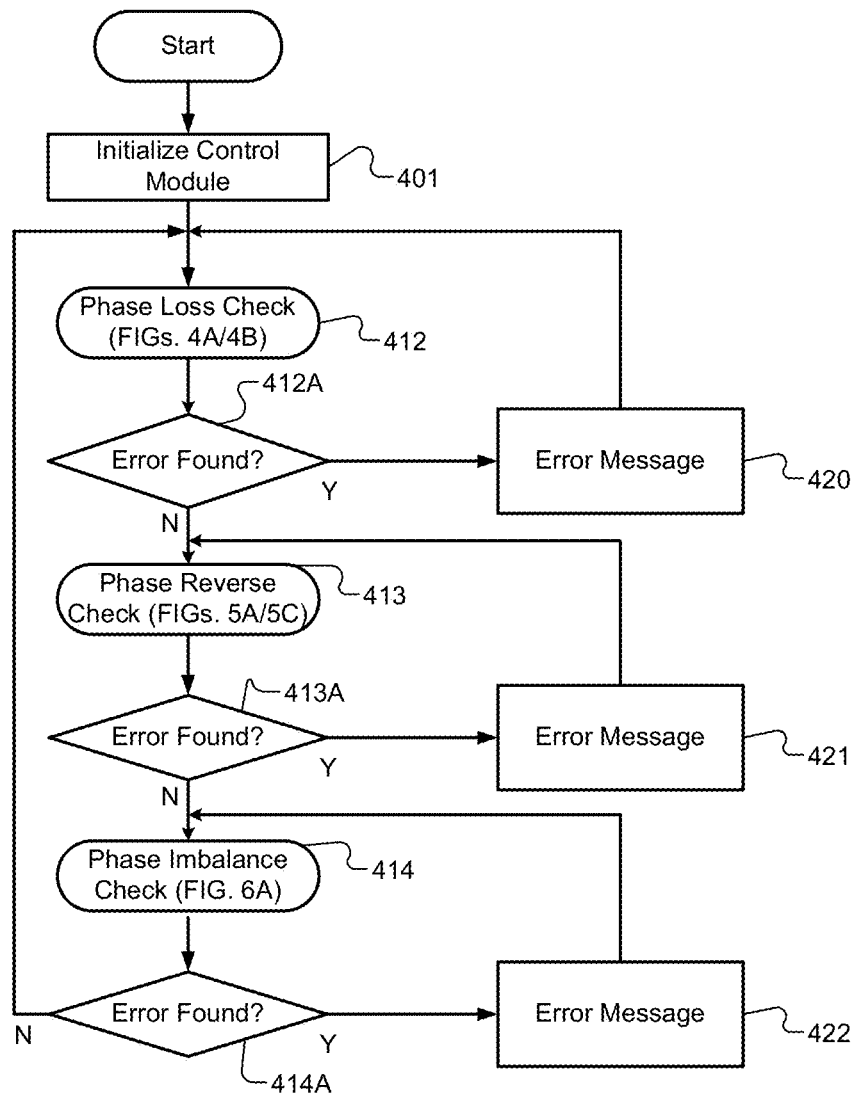

Referring now to FIG. 3A, steps 412, 413, and 414 set flags when errors occur. Steps 412A, 413A, and 414A check these flags to determine whether errors have occurred. If so, control transfers to steps 420, 421, and 422, respectively. In steps 420, 421, and 422, an appropriate error message is generated. Power supply errors may cause the motor 102 to overheat or run in an undesired manner. Based on the error message, the control module 120 may disable the motor 102 or perform other remedial action, such as decreasing a load on the motor 102 or decreasing a speed of the motor 102.

For example only, the control module 120 may instruct the motor 102 to stop operation. In various implementations, the control module 120 may stop the motor 102 from operating by tripping a circuit interruption element, such as a relay or a circuit breaker, which will cut off power from the power supply lines U, V, and W to the motor 102. In various implementations, the control module 120 may monitor the error messages and change the remedial action performed based on historical information about the error messages.

For example, individual error messages may be logged along with a timestamp. If too many error messages occur within a predetermined time window, the control module 120 may disable the motor 102. If error messages are only occasionally generated, a service indicator may be activated. The service indicator may include an illuminated light, audible indicator, and/or an electronic indication, such as a network control message, email message, text message, etc. If error messages are being generated continuously, the control module 120 may immediately disable the motor 102.

Figure 4:
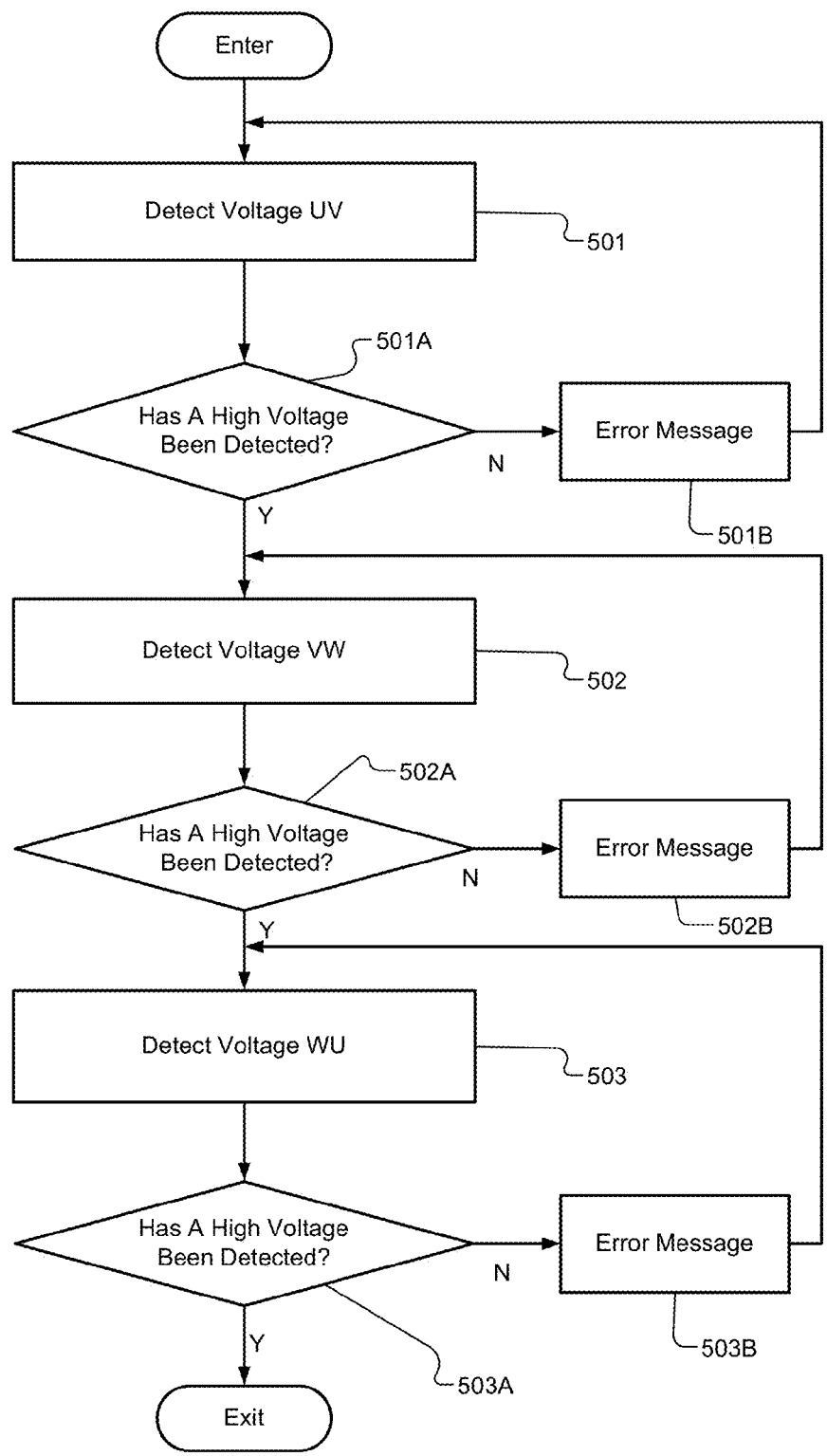
FIGS. 4-4C are flowcharts depicting exemplary steps performed in checking for phase loss according to the principles of the present disclosure.

Referring to FIG. 4, a logic flow diagram illustrating general operation of an exemplary implementation of step 402 in detail is shown. In step 501, for a detection period, control sets the value of the selection signal S1 at low and the values of the selection signals S2 and S3 at high. Control module 120 detects the line voltage signal S4 received at the node 34 to determine if a high value above a predetermined threshold has been received in the detection period. In step 501A, control determines a next step based on a result of step 501; if a high value is not detected in the detection period, then either ϕU or ϕV is missing in the detection period, and control sends out an error message in step 501B, and returns to step 501; if a high value is detected, control goes to a next step.

In step 502, for a detection period, control sets the value of the selection signal S2 at low, and the values of the selection signals S1 and S3 at high. Control module 120 detects the line voltage signal S4 received at the node 34 to determine if a high value above a predetermined threshold has been received in the detection period. In step 502A, control determines a next step based on a result of step 502; if a high value is not detected in the detection period, then either ϕV or ϕW is missing in the detection period, and control sends out an error message in step 502B and returns to step 502; if a high value is detected, control goes to a next step.

In step 503, for a detection period, control sets the value of the selection signal S3 at low, and the values of the selection signals S1 and S2 at high. Control module 120 detects the line voltage signal S4 received at node N34 to determine if a high value above a predetermined threshold has been received in the detection period. In step 503A, control determines a next step based on a result of step 503; if a high voltage is not detected in the detection period, then either ϕW or ϕU is missing in the detection period, and control sends out an error message in step 503B and returns to step 503; if a high voltage is detected, control exits step 402.

Figure 4A:
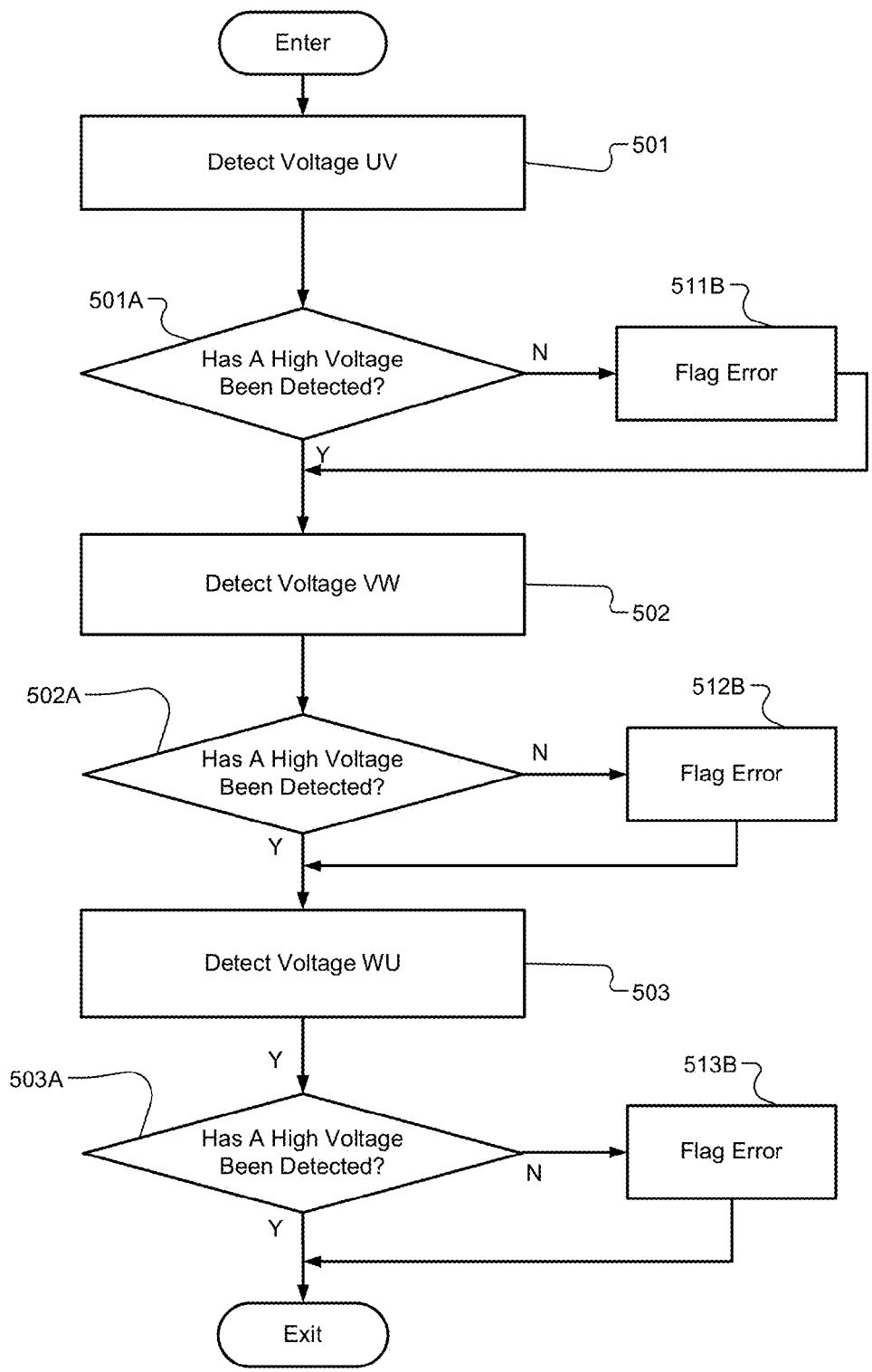

Referring to FIG. 4A, a logic flow diagram illustrating general operation of an exemplary implementation of step 412 in detail is shown. The operation shown in FIG. 4A is generally similar to the operation shown in FIG. 4. In this exemplary implantation of step 412, in step 501A if a high value above a predetermined threshold has not been detected in the detection period, control flags an error in step 511B and then enters into step 502. In step 502A if a high value above a predetermined threshold has not been detected in the detection period, control flags an error in step 512B and enters into step 504. In step 503A if a high value above a predetermined threshold has not been detected in the detection period, control flags an error a 513B and exits step 412.

Figure 4B:
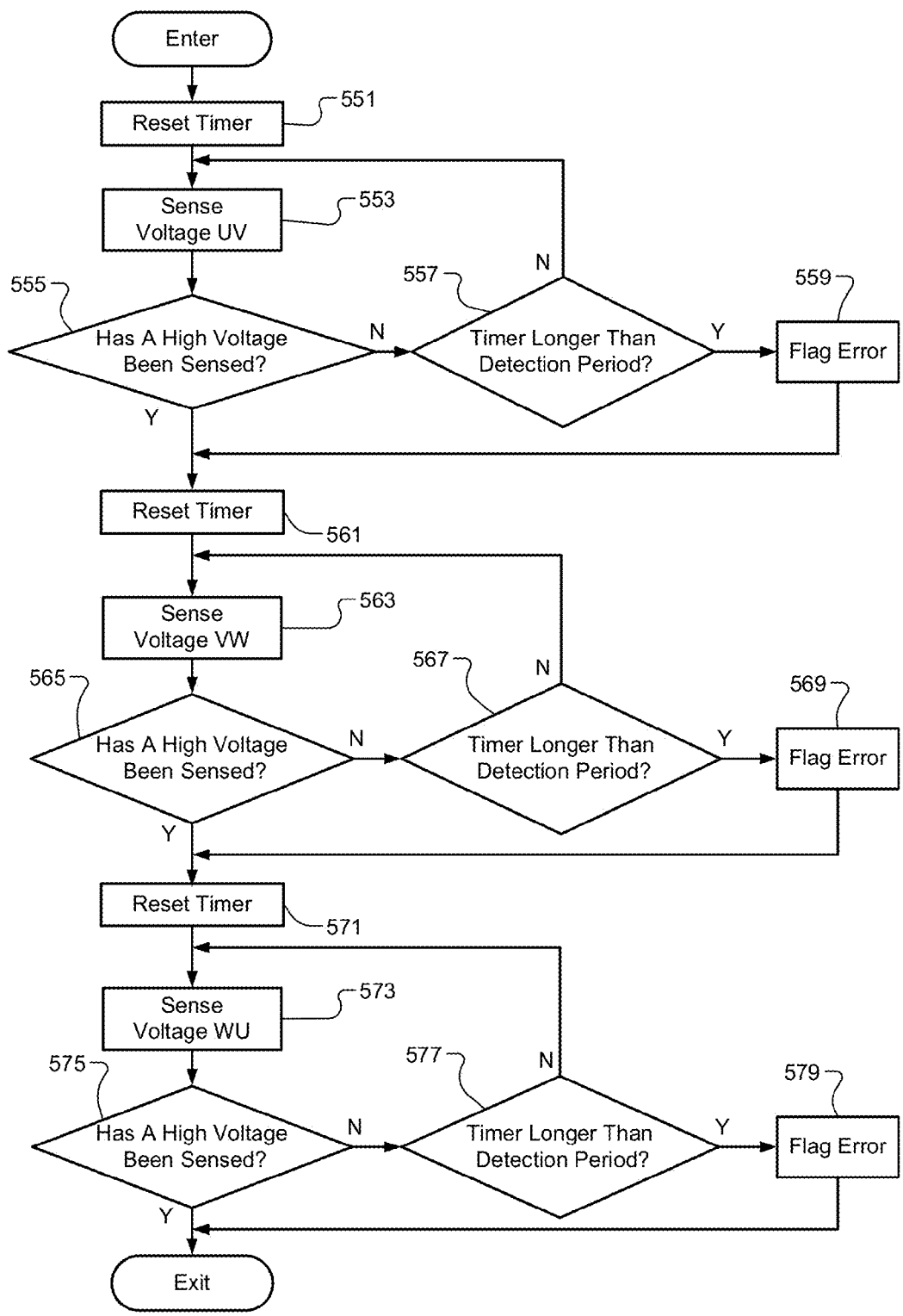

Referring to FIG. 4B, a logic flow diagram illustrating general operation of yet another exemplary implementation of step 412 in detail is shown. The control module 120 enters into step 412 and starts from step 551. In step 551, control resets a timer for a detection period. Next, in step 553, control sets the value of the selection signal S1 at low and the values of the selection signals S2 and S3 at high, and then senses a voltage of the line voltage signal S4 received at the node 34 representing the line voltage UV. In step 555, control determines if the sensed voltage is greater than a predetermined threshold; if yes, control enters step 561; if not, control enters step 557. In step 557, control checks the timer and determines if the predetermined period of time has lapsed; if not, control returns back to step 553; if yes, control flags an error in step 559 and enters step 561.

In step 561, control resets the timer again for the predetermined period of time. Next, in step 563, control sets the value of the selection signal S2 at low and the values of the selection signals S1 and S3 at high, and then senses a voltage of the line voltage signal S4 received at the node 34 representing the line voltage VW. In step 565, control determines if the sensed voltage is greater than the predetermined threshold; if yes, control enters step 571; if not, control enters step 567. In step 567, control checks the timer and determines if the predetermined period of time has lapsed; if not, control returns back to step 563; if yes, control flags an error in step 569 and enters step 571.

In step 571, control resets the timer again for the predetermined period of time. Next, in step 573, control sets the value of the selection signal S3 at low and the values of the selection signals S1 and S2 at high, and then senses a voltage of the line voltage signal S4 received at the node 34 representing the line voltage WU. In step 575, control determines if the sensed voltage is greater than the predetermined threshold; if yes, control exits step 412; if not, control enters step 577. In step 577, control checks the timer and determines if the predetermined period of time has lapsed; if not, control returns back to step 573; if yes, control flags an error in step 579 and exits step 412.

Figure 4C:
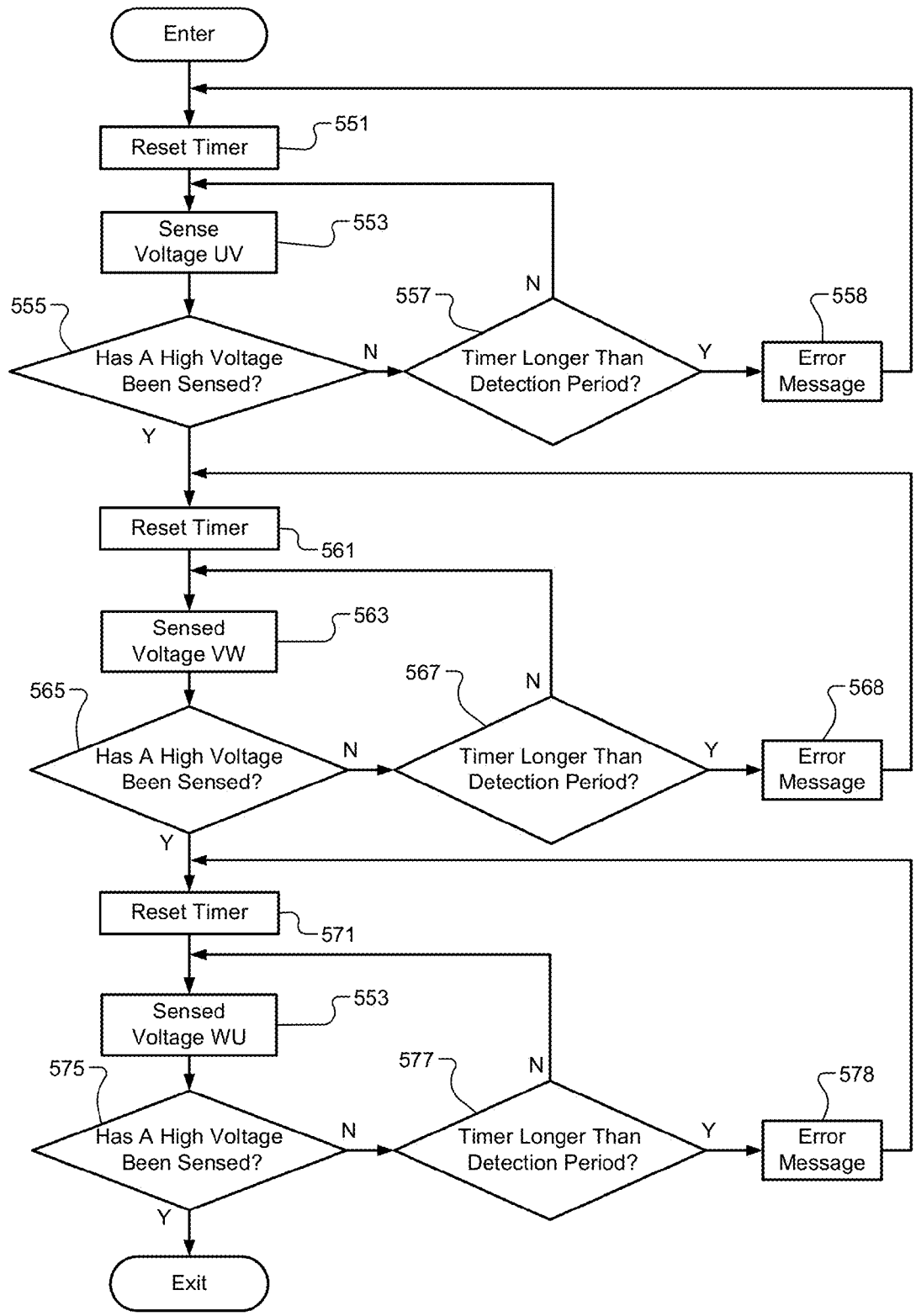

Referring to FIG. 4C, a logic flow diagram illustrating general operation of another exemplary implementation of step 402 in detail is shown. The operation shown in FIG. 4C is generally similar to the operation shown in FIG. 4B. In this implantation of step 402, in step 557, control checks the timer and determines if the predetermined period of time has lapsed; if not, control returns back to step 553; if yes, control sends out an error message in step 558 and returns to step 551. In step 567, control checks the timer and determines if the predetermined period of time has lapsed; if not, control returns back to step 563; if yes, control sends out an error message in step 568 and returns to step 561. In step 577, control checks the timer and determines if the predetermined period of time has lapsed; if not, control returns back to step 573; if yes, control sends out an error message in step 578 and returns to step 571.

Figure 5:
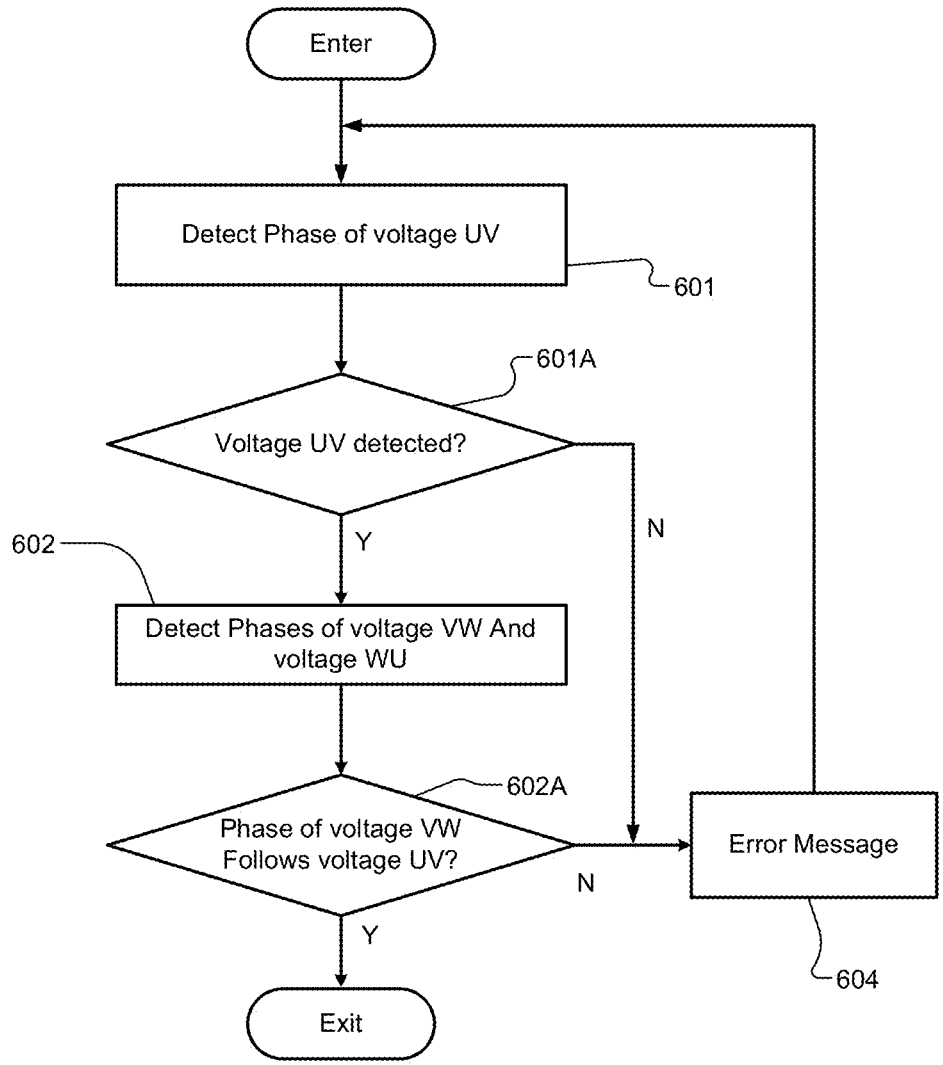
FIGS. 5-5C are flowcharts depicting exemplary steps performed in checking for phase reversal according to the principles of the present disclosure.

Referring to FIG. 5, a logic flow diagram illustrating an exemplary implementation of step 403 in detail is shown. In step 601, control sets the selection signal S3 at low and the selection signals S2 and S1 at high, and detects the line voltage signal S4 representing the line voltage UV received at the node N34. In step 601A, control determines if a high voltage above a predetermined threshold has been detected in a detection period; if not, control can send out an error message in step 604 and then return to step 601; If yes, control goes to step 602. In step 602, control sets the selection signal S3 at high, and initially sets one of the selection signal S2 and the selection signal S1 at high and the other at low and then alternates the values of the selection signal S1 and the selection signal S2 rapidly in a detection period. At the same time, control detects the value of line voltage signal S4.

In step 602A, control determines a next step based on a result of step 602. If a first high voltage above a predetermined threshold of the line voltage signal S4 is detected at a time when the selection signal S2 is low, then the phase of the line voltage VW follows the phase of line voltage UV before the phase of WU; control can decide this is a correct phase sequence and exit step 403. If the first high voltage above a predetermined threshold of line voltage signal S4 is detected at a time when the selection signal S1 is low, then the phase of the line voltage WU follows the phase of the line voltage UV before the phase of the line voltage VW; control can decide this is not a correct phase sequence, send out an error message in step 604, and return to step 601.

In the above described steps, control is configured to consider the correct phase sequence as the phase of line voltage VW following the phase of line voltage UV and the phase of line voltage WU following the phase of line voltage VW. It is understood, however, that the correct phase sequence can be alternatively defined as, e.g., the phase of line voltage WU following the phase of line voltage UV and the phase of line voltage VW following the phase of line voltage WU; control can be configured accordingly. It is also understood that in step 601, control can be configured to set the selection signal S2 or the selection signal S1 at low, and the other two selection signals at high, and thus detect the line voltage signal S4 representing the line voltage VW or the line voltage WU; accordingly, in steps 602 and 602A, control can be configured to determine if the phase of line voltage WU or line voltage UV follows.

The exemplary implementation shown in FIG. 5 can be modified such that instead of sending an error message and returning to step 601, control flags an error in step 604 and then exits step 403.

Figure 5A:
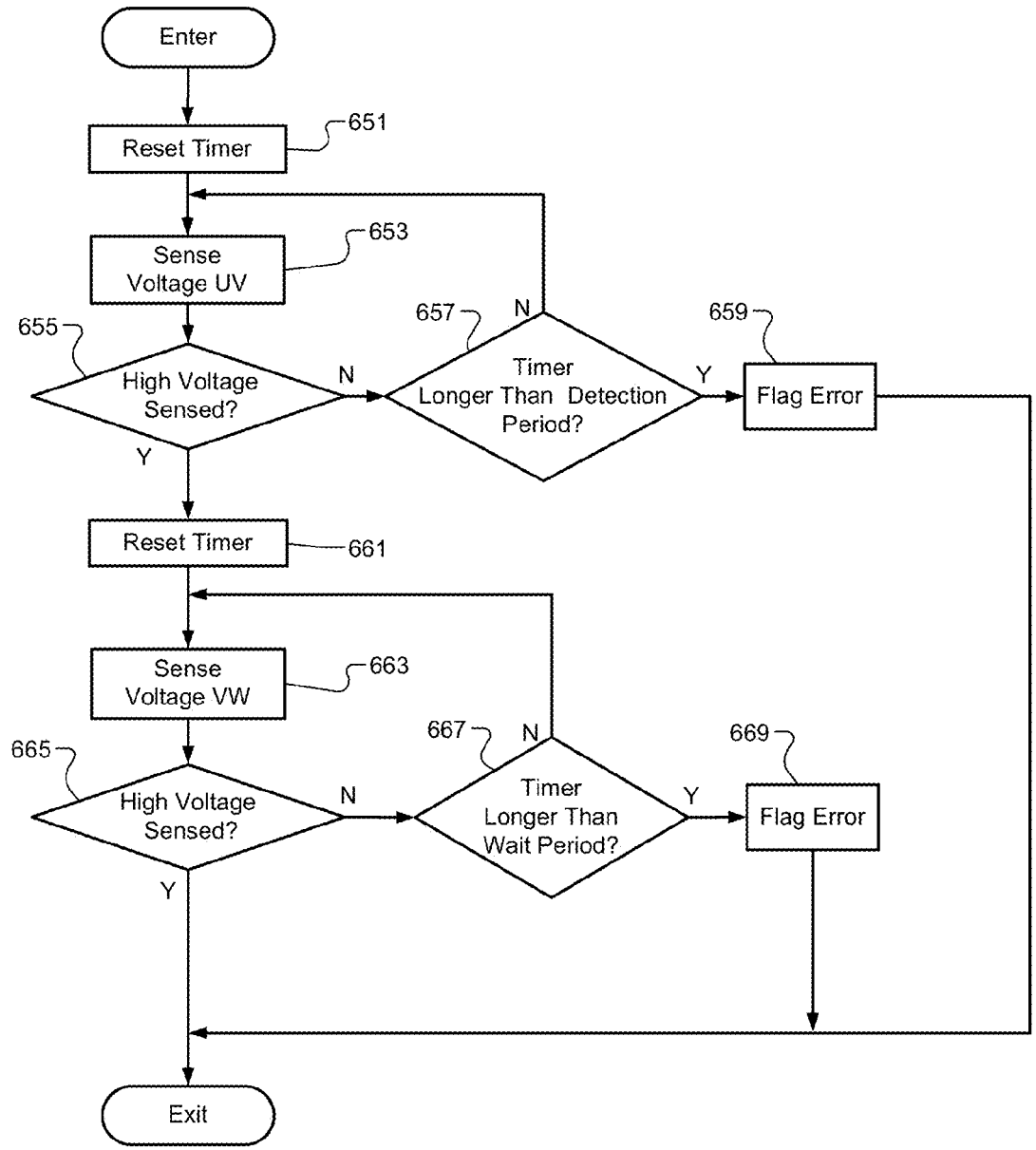

Referring to FIG. 5A, a logic flow diagram illustrating an exemplary implementation of step 413 is shown. A wait period can be defined as the time interval between peak values of two consecutive phase voltage in normal operation of the three-phase power supply (e.g., approximately one third of a cycle of the power supply). Control module 120 resets a timer in step 651. In step 653, control sets the value of the selection signal S1 at low and the values of the selection signals S2 and S3 at high, and then senses a voltage of the line voltage signal S4 received at node 34 representing the line voltage UV. In step 655, control determines if the sensed voltage is greater than a predetermined threshold; if yes, control enters step 661; if not, control enters step 657. In step 657, control checks the timer and determines if a detection period has lapsed; if not, control returns back to step 653; if yes, control flags an error in step 659 and then exits step 413.

Control module 120 resets the timer in step 661. In step 663, control sets the value of the selection signal S2 at low and the values of the selection signals S1 and S3 at high, and then senses a voltage of the line voltage signal S4 received at node 34 representing line voltage VW. In step 665, control determines if the sensed voltage is greater than a predetermined threshold; if yes, control exits step 413; if not, control enters step 667. In step 667, control checks the timer and determines if a wait period plus a tolerance period has lapsed; if not, control returns back to step 663; if yes, control flags an error in step 669 and then exits step 413.

Figure 5B:
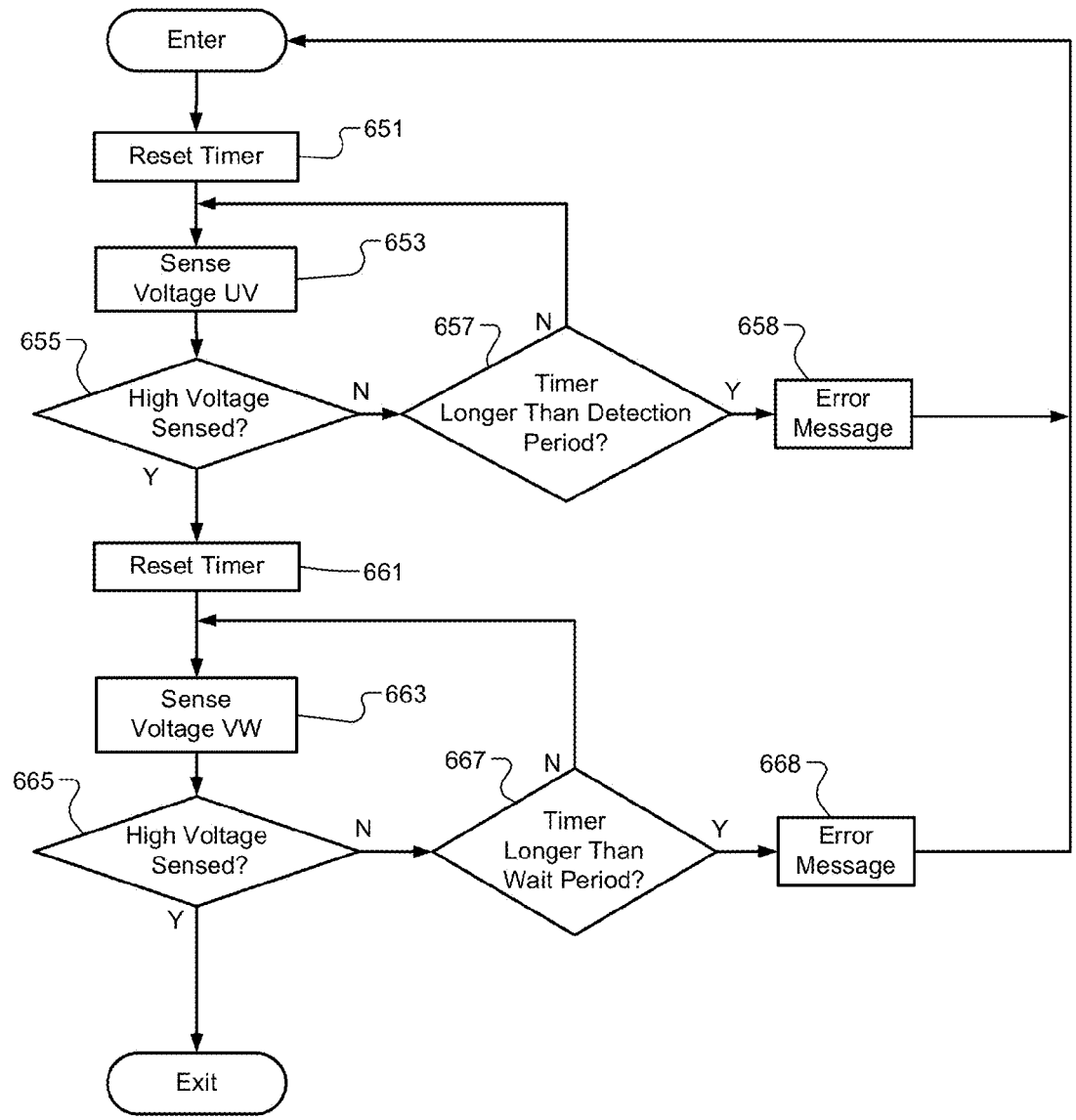

Referring to FIG. 5B, a logic flow diagram illustrating general operation of another exemplary implementation of step 403 in detail is shown. The operation shown in FIG. 5B is generally similar to the operation shown in FIG. 5A. Instead of flagging an error in step 659 and step 669, control can send out an error message in step 658 and step 668. After executing steps 658 and 668, control returns to step 651.

Figure 5C:
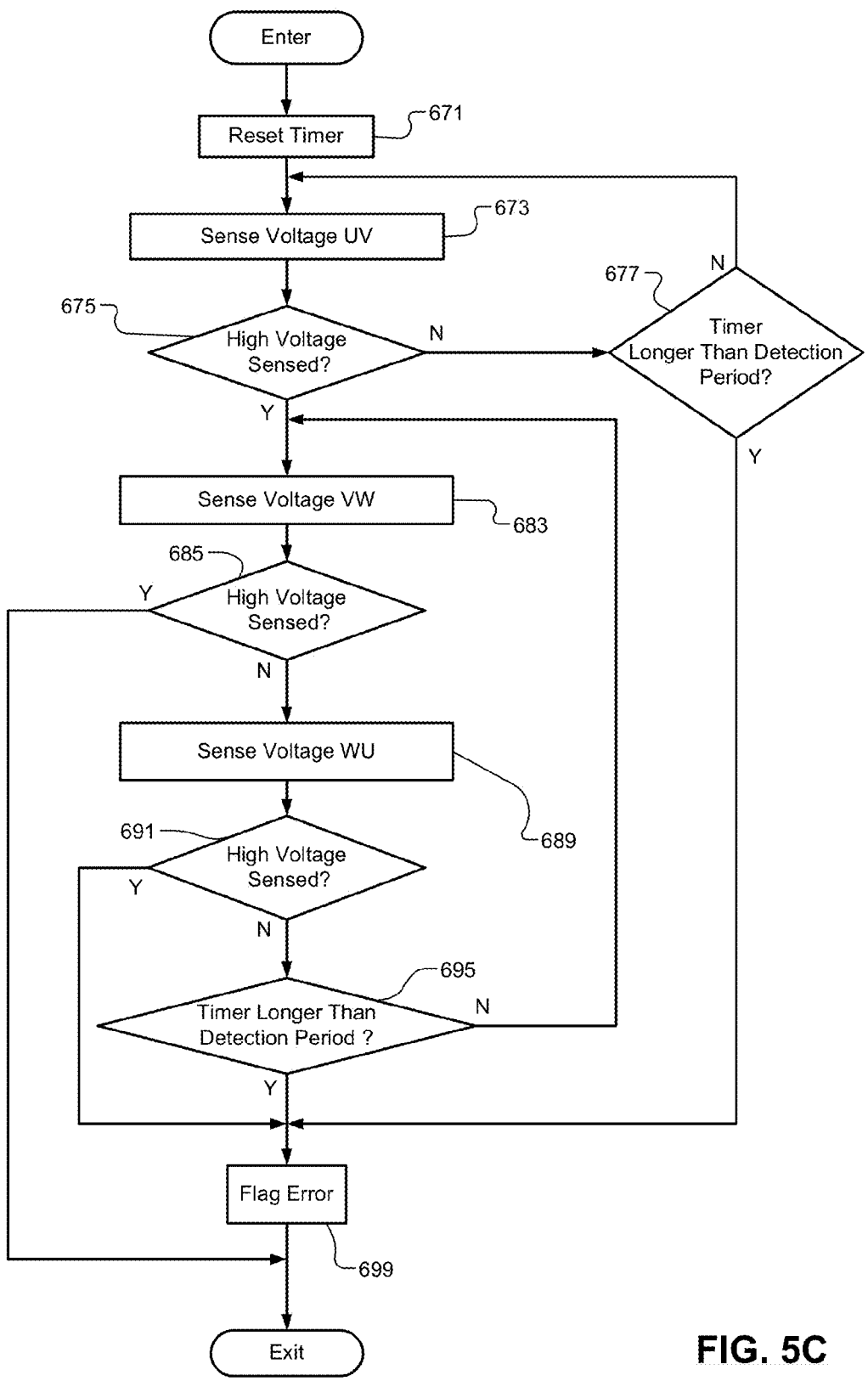

Referring to FIG. 5C, a logic flow diagram illustrating general operation of another exemplary implementation of step 413 in detail is shown. Control module 120 resets a timer in step 671. In step 673, control sets the value of the selection signal S1 at low and the values of the selection signals S2 and S3 at high, and then senses a voltage of the line voltage signal S4 received at the node 34 representing the line voltage UV. In step 675, control determines if the sensed voltage is greater than a predetermined threshold; if yes, control enters step 683; if not, control enters step 677. In step 677, control checks the timer and determines if a detection period has lapsed; if not, control returns back to step 673; if yes, control flags an error in step 699 and then exits step 413.

In step 683, control sets the value of the selection signal S2 at low and the values of the selection signals S1 and S3 at high, and then senses a voltage of the line voltage signal S4 received at node 34 representing the line voltage VW. In step 685, control determines if the sensed voltage is greater than a predetermined threshold; if yes, control can determine this is a correct sequence and exit the operation of step 413; if not, control enters step 689. In step 689, control sets the value of the selection signal S3 at low and the values of the selection signals S1 and S2 at high, and then senses a voltage of the line voltage signal S4 received at the node 34 representing the line voltage WU.

In step 691, control determines if the sensed voltage is greater than a predetermined threshold; if yes, control has detected a high value of the line voltage WU before a high value of the line voltage VW, and control can determine this is not a correct sequence, flag an error in step 699 and exit the operation of step 413; if not, control enters step 695. In step 695, control checks the timer to determine if the detection period has lapsed; if not, control returns to step 683; if yes, control has not detected either the line voltage VW or the line voltage WU in the detection period, and thus control flags an error in step 699 and exits the operation of step 413.

Figure 6:
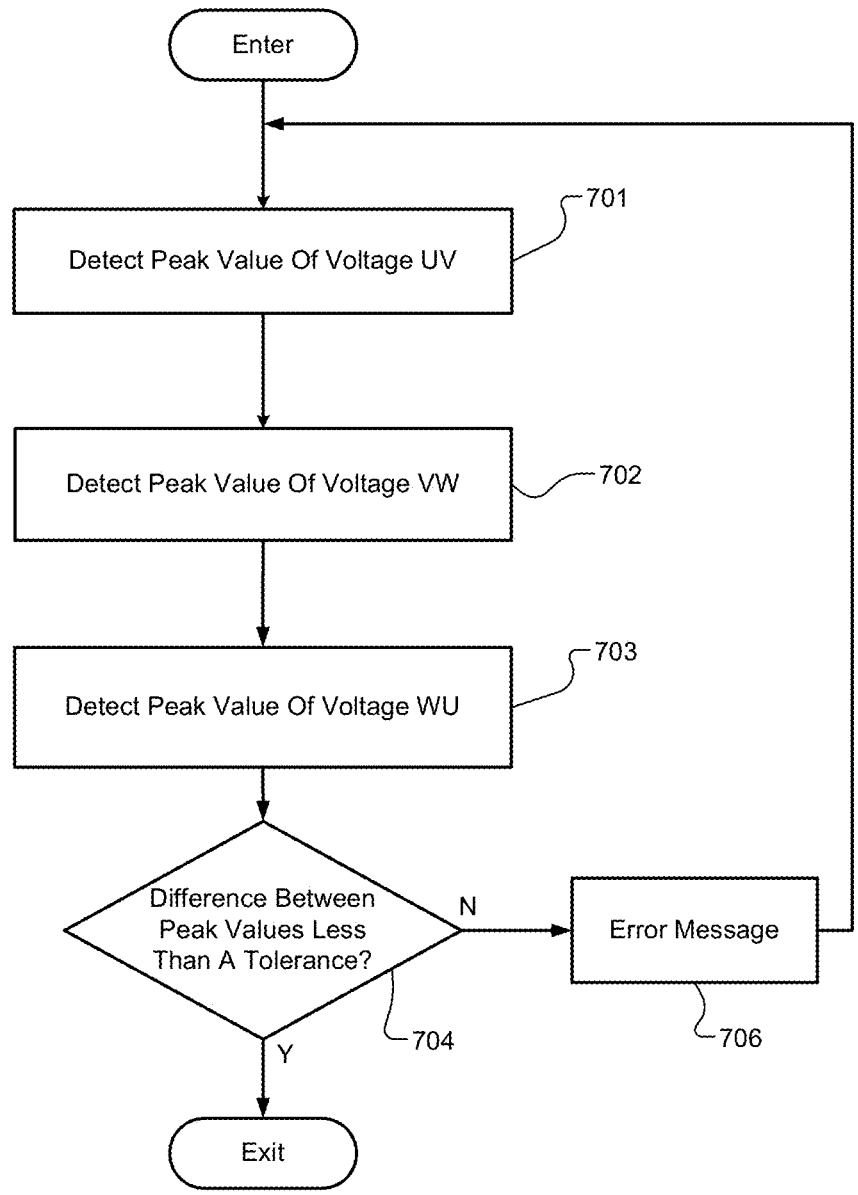
FIGS. 6-6A are flowcharts depicting exemplary steps performed in checking for peak voltage imbalance according to the principles of the present disclosure.

Referring to FIG. 6, a logic flow diagram illustrating step 404 in detail is shown. In step 701, control set the selection signal S3 at high for a detection period and detects a peak value of line voltage signal S4 representing the line voltage UV. In step 702, control set the selection signal S2 at high for a detection period and detects a peak value of the line voltage signal S4 representing the line voltage VW. In step 703, control set the selection signal S1 at high for a detection period and detects a peak value of the line voltage signal S4 representing the line voltage WU.

In step 704, control compares the peak values of the line voltage signal S4 detected for the line voltage UV, the line voltage VW, and the line voltage WU and determines if a difference between selected two peak values is less than a predetermined tolerance. If the difference exceeds the tolerance, control sends out an error message in step 706 and returns to step 701; if the differences are within the tolerance, control exits step 404

Figure 6A:
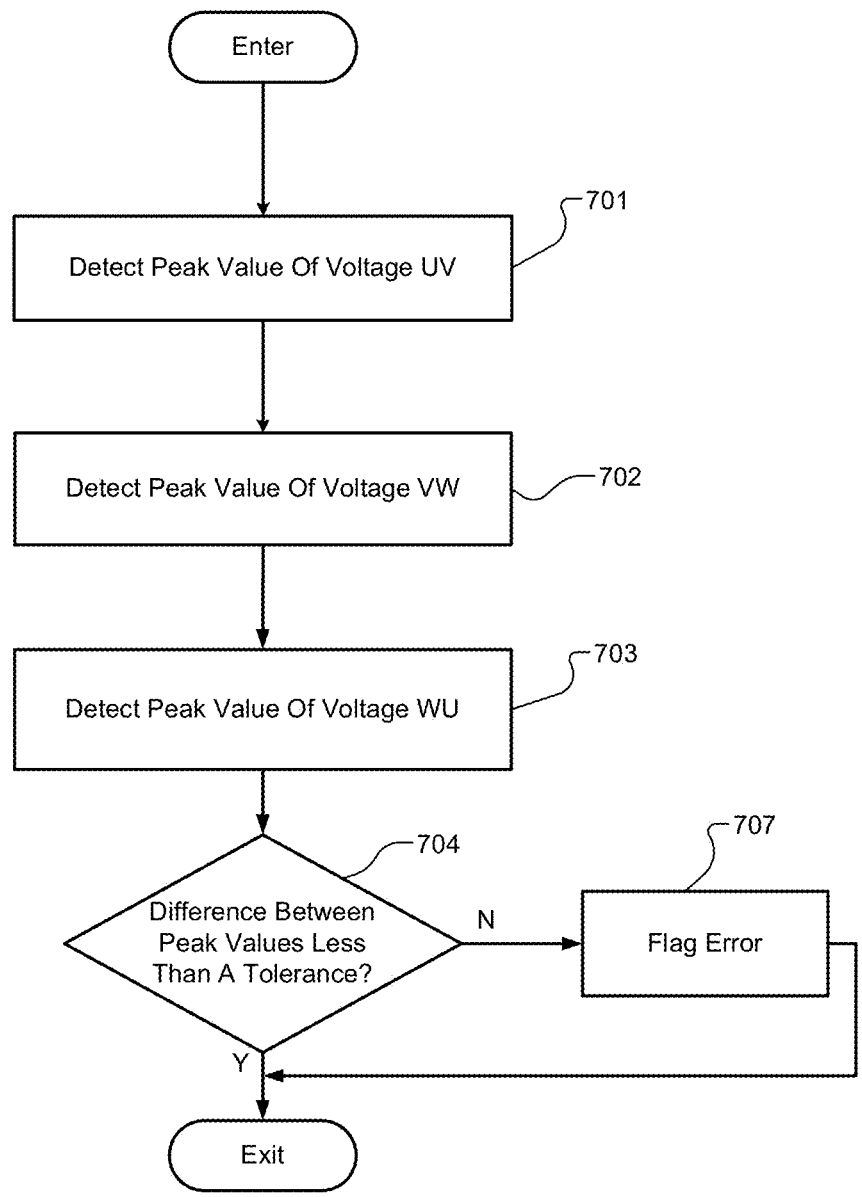

Referring to FIG. 6A, a logic flow diagram illustrating a general operation of an exemplary implementation of step 414 in detail is shown. The operation shown in FIG. 6A is generally similar to the operation shown in FIG. 6. Instead of sending out an error message in step 706, control can flag an error in step 707 and then exit step 414.

The description herein is merely exemplary in nature and, thus, variations that do not depart from the gist of that which is described are intended to be within the scope of the disclosure. Such variations are not to be regarded as a departure from the spirit and scope of the disclosure.

What is claimed is:

1. A monitoring apparatus connected, in parallel with a motor, to a plurality of power supply lines, each of the plurality of power supply lines having a different phase, the monitoring apparatus comprising:
   a first isolator configured to, in response to a first control signal, selectively allow a first current to flow from a first power supply line of the plurality of power supply lines to a second power supply line of the plurality of power supply lines through a third isolator, wherein the first current is electrically isolated from the first control signal;
   a second isolator configured to, in response to a second control signal, selectively allow a second current to flow from the second power supply line of the plurality of power supply lines to a third power supply line of the plurality of power supply lines through the third isolator, wherein the second current is electrically isolated from the second control signal; and
   a control module configured to:
      generate the first control signal to control the first isolator,
      generate the second control signal to control the second isolator,
      receive a first signal corresponding to a total current flowing through the third isolator, wherein the total current includes both the first current and the second current, and
      selectively generate a phase failure signal in response to the first signal indicating that a failure of at least one of the plurality of power supply lines has occurred.

2. The monitoring apparatus of claim 1 further comprising a fourth isolator configured to, in response to a third control signal from the control module, selectively allow a third current to flow from the third power supply line of the plurality of power supply lines to the first power supply line of the plurality of power supply lines through the third isolator, wherein the total current also includes the third current, and wherein the third current is electrically isolated from the third control signal.

3. The monitoring apparatus of claim 2 wherein the control module is configured to:
   sequentially activate the first isolator, the second isolator, and the fourth isolator; and
   repeat the sequential activation.

4. The monitoring apparatus of claim 2 wherein the plurality of power supply lines consists of only the first power supply line, the second power supply line, and the third power supply line.

5. The monitoring apparatus of claim 4 wherein the monitoring apparatus is further connected to a neutral line associated with the plurality of power supply lines.

6. The monitoring apparatus of claim 2 wherein the first isolator comprises a first optocoupler, the second isolator comprises a second optocoupler, and the fourth isolator comprises a third optocoupler.

7. The monitoring apparatus of claim 1 wherein the first isolator comprises a first optocoupler and the second isolator comprises a second optocoupler.

8. The monitoring apparatus of claim 1 further comprising the third isolator, wherein the third isolator is configured to output the first signal to the control module in response to the total current, wherein the first signal is electrically isolated from the total current.

9. The monitoring apparatus of claim 8 wherein the third isolator comprises an optocoupler.

10. The monitoring apparatus of claim 1 wherein the control module is configured to:
    while the first isolator is activated, deactivate the second isolator; and
    while the second isolator is activated, deactivate the first isolator.

11. The monitoring apparatus of claim 1 wherein the control module is configured to halt operation of the motor in response to generation of the phase failure signal.

12. The monitoring apparatus of claim 1 wherein:
    the control module is configured to activate the first isolator for a predetermined duration;
    the plurality of power supply lines carry periodic power signals characterized by a first period; and
    the predetermined duration is based on a length of the first period.

13. The monitoring apparatus of claim 12 wherein the predetermined duration is equal to the length of the first period plus a predetermined offset.

14. The monitoring apparatus of claim 1 wherein the first signal is directly proportional to the total current.

15. The monitoring apparatus of claim 1 further comprising generating the phase failure signal in response to a peak value of the first signal over a predetermined period of time being less than a predetermined threshold.

16. A motor system comprising:
    the monitoring apparatus of claim 1; and
    the motor.

17. A method of operating a monitoring apparatus connected, in parallel with a motor, to a plurality of power supply lines, each of the plurality of power supply lines having a different phase, the method comprising:
    generating a first control signal that selectively activates a first isolator to allow a first current to flow from a first power supply line of the plurality of power supply lines to a second power supply line of the plurality of power supply lines through a third isolator, wherein the first control signal is electrically isolated from the first current;
    generating a second control signal that selectively activates a second isolator to allow a second current to flow from the second power supply line of the plurality of power supply lines to a third power supply line of the plurality of power supply lines through the third isolator, wherein the second control signal is electrically isolated from the second current;
    receiving a first signal corresponding to a total current, wherein the total current includes both the first current and the second current flowing through the third isolator; and
    selectively generating a phase failure signal in response to the first signal indicating that a failure of at least one of the plurality of power supply lines has occurred.

18. The method of claim 17 further comprising generating a third control signal that selectively activates a fourth isolator to allow a third current to flow from the third power supply line of the plurality of power supply lines to the first power supply line of the plurality of power supply lines through the third isolator, wherein the total current also includes the third current and wherein the third control signal is electrically isolated from the third current.

19. The method of claim 18 further comprising:
    sequentially activating the first isolator, the second isolator, and the fourth isolator; and
    repeating the sequential activation.

20. The method of claim 18 wherein the plurality of power supply lines consists of only the first power supply line, the second power supply line, and the third power supply line.

21. The method of claim 20 wherein the monitoring apparatus is further connected to a neutral line associated with the plurality of power supply lines.

22. The method of claim 17 further comprising:
while the first isolator is activated, deactivating the second isolator; and
while the second isolator is activated, deactivating the first isolator.

23. The method of claim 17 further comprising halting operation of the motor in response to generation of the phase failure signal.

24. The method of claim 17 further comprising activating the first isolator for a predetermined duration, wherein the plurality of power supply lines carry periodic power signals characterized by a first period, and wherein the predetermined duration is based on a length of the first period.

25. The method of claim 24 wherein the predetermined duration is equal to the length of the first period plus a predetermined offset.

26. The method of claim 17 wherein the first signal is directly proportional to the total current.

27. The method of claim 17 further comprising generating the phase failure signal in response to a peak value of the first signal over a predetermined period of time being less than a predetermined threshold.

\* \* \* \* \*